(12) United States Patent
Kim et al.

(10) Patent No.: US 11,094,745 B2
(45) Date of Patent: Aug. 17, 2021

(54) VARIABLE RESISTANCE MEMORY DEVICE AND METHOD OF FABRICATING THE SAME

(71) Applicant: Samsung Electronics Co., Ltd., Suwon-si (KR)

(72) Inventors: Byongju Kim, Hwaseong-si (KR); Young-Min Ko, Hwaseong-si (KR); Jonguk Kim, Yongin-si (KR); Kwangmin Park, Seoul (KR); Jeonghee Park, Hwaseong-si (KR); Dongsung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 150 days.

(21) Appl. No.: 16/396,650

(22) Filed: Apr. 27, 2019

(65) Prior Publication Data

US 2020/0066800 A1  Feb. 27, 2020

(30) Foreign Application Priority Data

Aug. 24, 2018  (KR) ................ 10-2018-0099180

(51) Int. Cl.
*H01L 27/24* (2006.01)
*H01L 45/00* (2006.01)

(52) U.S. Cl.
CPC .......... *H01L 27/2481* (2013.01); *H01L 45/06* (2013.01); *H01L 45/085* (2013.01); *H01L 45/144* (2013.01); *H01L 45/145* (2013.01)

(58) Field of Classification Search
CPC ... H01L 27/2481; H01L 45/06; H01L 45/085; H01L 45/145; H01L 45/144; H01L 27/2463; H01L 45/126; H01L 45/1233; H01L 45/1675; H01L 45/12; H01L 45/1683

See application file for complete search history.

(56) References Cited

U.S. PATENT DOCUMENTS

| | | |
|---|---|---|
| 9,362,340 B2 | 6/2016 | Terai et al. |
| 9,704,923 B1 | 7/2017 | Bernhardt et al. |
| 9,768,378 B2 | 9/2017 | Pellizzer et al. |
| 9,780,144 B2 | 10/2017 | Seong et al. |
| 9,887,354 B2 | 2/2018 | Jeong et al. |
| 9,899,451 B2 | 2/2018 | Pellizzer et al. |
| 10,157,790 B1 * | 12/2018 | You ................. H01L 21/76897 |
| 2017/0117327 A1 | 4/2017 | Terai |
| 2018/0040669 A1 | 2/2018 | Wu et al. |

* cited by examiner

*Primary Examiner* — David Vu
(74) *Attorney, Agent, or Firm* — Muir Patent Law, PLLC

(57) ABSTRACT

A variable resistanvce memory device may include a plurality of first conductive lines extending in a first direction, a plurality of second conductive lines extending in a second direction, a plurality of memory cells, each memory cell at a respective intersection, with respect to a top down view, between a corresponding one of the first conductive lines and a corresponding one of the second conductive lines, each memory cell comprising a variable resistance structure and a switching element sandwiched between a top electrode and a bottom electrode, and a first dielectric layer filling a space between the switching elements of the memory cells. A top surface of the first dielectric layer is disposed between bottom and top surfaces of the top electrodes of the memory cells.

20 Claims, 16 Drawing Sheets

VARIABLE RESISTANCE MEMORY DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2018-0099180 filed on Aug. 24, 2018 in the Korean Intellectual Property Office, the entire contents of which are hereby incorporated by reference.

BACKGROUND

The present inventive concepts relates to semiconductor devices, and more particularly, to a variable resistance memory device and a method of fabricating the same.

Semiconductor devices may encompass memory devices and logic devices. Memory devices store data. In general, semiconductor memory devices can be broadly classified into volatile memory devices and nonvolatile memory devices. The volatile memory devices, such as Dynamic Random Access Memory (DRAM) and Static Random Access Memory (SRAM), lose stored data when their power supply is interrupted. The nonvolatile memory devices, such as programmable ROM (PROM), erasable PROM (EPROM), electrically erasable EPROM (EEPROM), and Flash memory device, do not lose stored data even when their power supply is inhibited.

Next generation semiconductor memory devices, for example, ferroelectric random access memory (FRAM), magnetic random access memory (MRAM) and phase change random access memory (PRAM), are recently being developed to meet the trend of high performance and low power of the semiconductor memory devices. The next generation semiconductor memory devices include a material having characteristics that their resistance becomes different depending on applied electric current or voltage and their resistance is maintained even their electric current or voltage supply is interrupted.

SUMMARY

Some example embodiments of the present inventive concepts provide a variable resistance memory device and a method of fabricating the same, which method is able to improve electrical characteristics of the variable resistance memory device and to achieve process simplification.

According to some example embodiments of the present inventive concepts, a variable resistance memory device may comprise: a plurality of first conductive lines extending in a first direction; a plurality of second conductive lines extending in a second direction; a plurality of memory cells, each memory cell at a respective intersection, with respect to a top down view, between a corresponding one of the first conductive lines and a corresponding one of the second conductive lines, each memory cell comprising a variable resistance structure and a switching element sandwiched between a top electrode and a bottom electrode; and a first dielectric layer filling a space between the switching elements of the memory cells. A top surface of the first dielectric layer may be disposed between bottom and top surfaces of the top electrodes of the memory cells.

According to some example embodiments of the present inventive concepts, a variable resistance memory device may comprise: a plurality of first conductive lines extending in a first direction; a plurality of second conductive lines extending in a second direction; a plurality of switching elements at intersections between the first conductive lines and the second conductive lines; a plurality of variable resistance structures between the switching elements and the first conductive lines; a plurality of top electrodes between the switching elements and the second conductive lines; a first dielectric layer filling a space between the switching elements; and a second dielectric layer on the first dielectric layer and filling a space between the top electrodes, the second dielectric layer having a dielectric constant greater than a dielectric constant of the first dielectric layer. A bottom surface of the first dielectric layer may be higher than top surfaces of the variable resistance structures.

According to some example embodiments of the present inventive concepts, a method of fabricating a variable resistance memory device may comprise: forming a plurality of variable resistance structures that are two-dimensionally arranged on a substrate; forming on the variable resistance structures a plurality of upper structures that include a plurality of switching elements and a plurality of top electrodes on the switching elements; and forming a first dielectric layer that fills a space between the upper structures. A top surface of the first dielectric layer may be higher than bottom surfaces of the top electrodes. The step of forming the first dielectric layer may comprise: performing a flowable vapor deposition process to form a preliminary dielectric layer between the upper structures; and performing a curing process to cure the preliminary dielectric layer.

DETAILED DESCRIPTION

Figure 1:
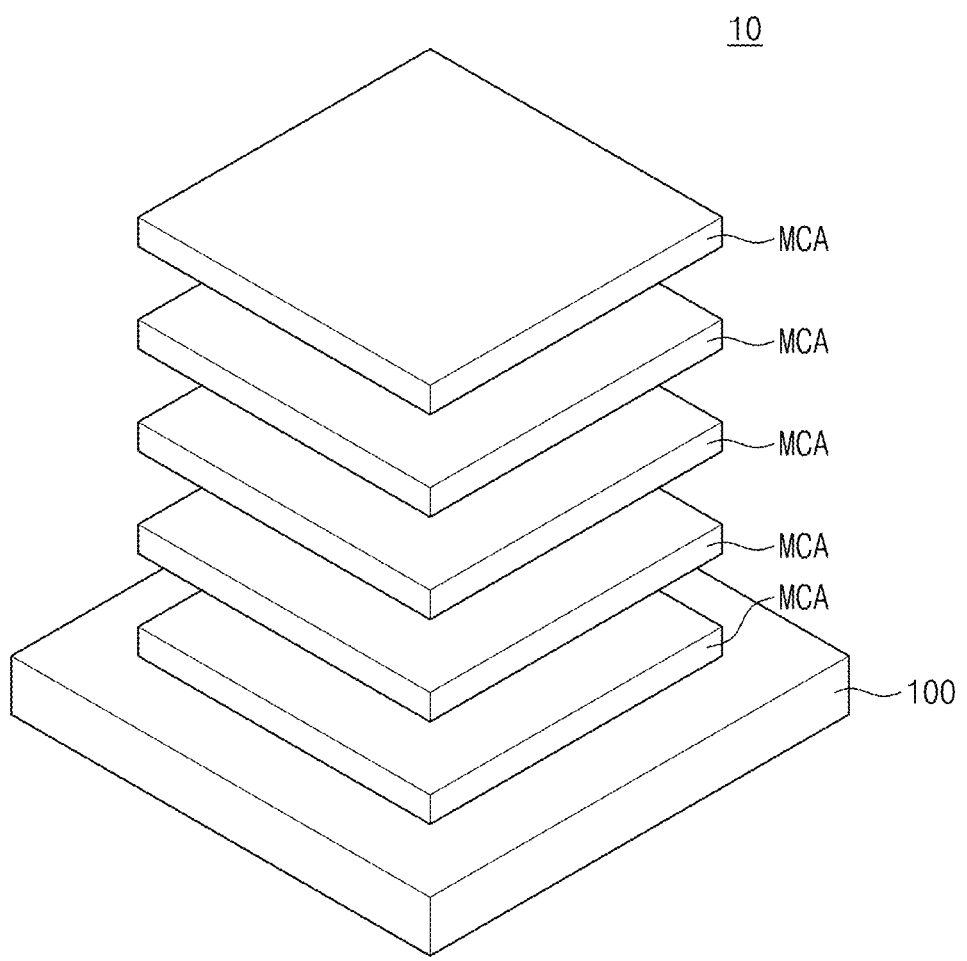
FIG. 1 illustrates a conceptual view showing a variable resistance memory device according to some example embodiments of the present inventive concepts.

FIG. 1 illustrates a conceptual view showing a variable resistance memory device according to some example embodiments of the present inventive concepts. Referring to FIG. 1, a variable resistance memory device 10 according to some example embodiments of the present inventive concepts may include a plurality of memory cell stacks MCA that are sequentially stacked on a substrate 100. Each of the memory cell stacks MCA may include a plurality of variable resistance memory cells that are arranged two-dimensionally. The variable resistance memory device 10 may include a plurality of conductive lines that are disposed to lie between the memory cell stacks MCA and to write, read, and erase the memory cells. FIG. 1 shows five memory cell stacks MCA, but some example embodiments of the present inventive concepts are not limited thereto. For example, the variable resistance memory device 10 may include only one memory cell stack MCA.

Figure 2:
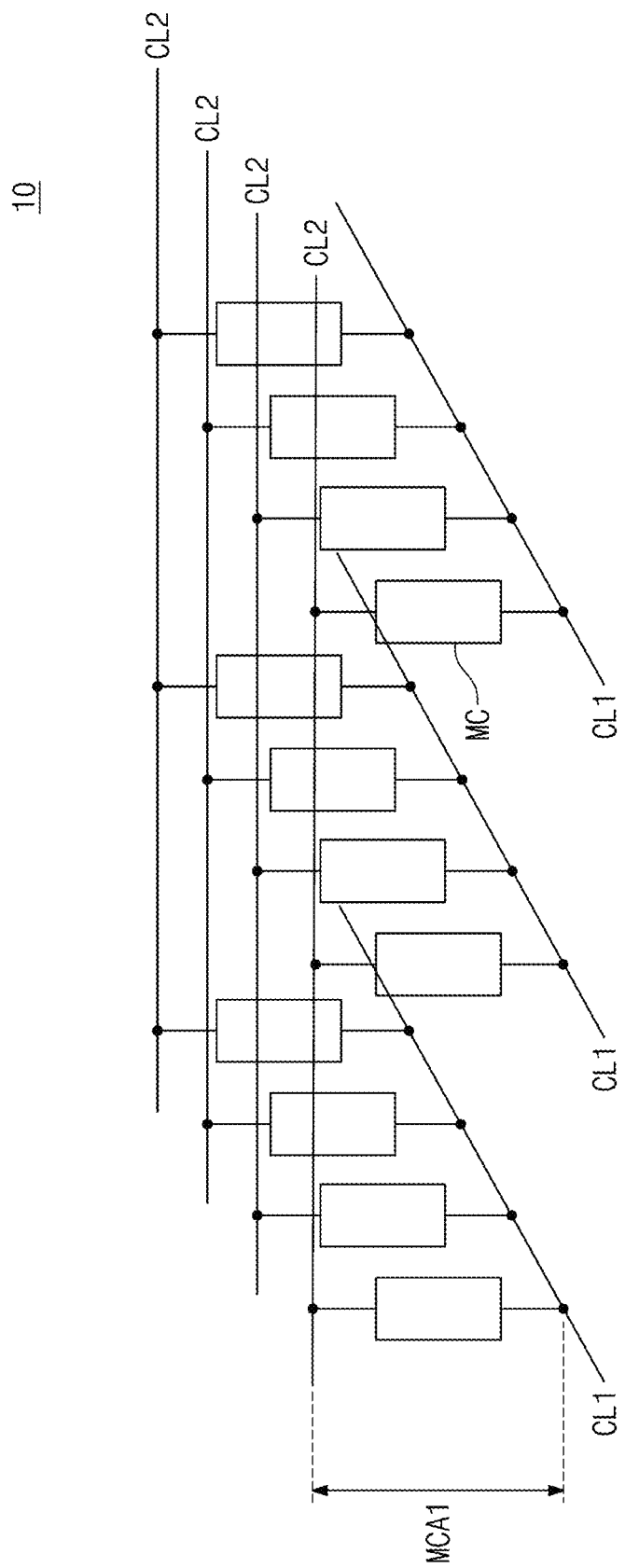
FIG. 2 illustrates a circuit diagram showing memory cell stacks of FIG. 1.

FIG. 2 illustrates a circuit diagram showing exemplary details of memory cell stacks MCA of FIG. 1. FIG. 2 shows one memory cell stack of the variable resistance memory device 10 referenced herein as a first memory cell stack MCA1. The first memory cell stack MCA1 may be and is representative of the structure of any one of the memory cell stacks MCA of FIG. 1. The first memory cell stack MCA1 may include memory cells MC at intersections between first conductive lines CL1 and second conductive lines CL2. Although not shown, a second memory cell stack may be provided on the first memory cell stack MCA1. Similar to the first memory cell stack MCA1, the second memory cell stack may include memory cells at intersections between third conductive lines and fourth conductive lines. For example, the third conductive lines may be conductive lines that are vertically spaced apart from the second conductive lines CL2. Alternatively, the second memory cell stack may share the second conductive lines CL2 with the first memory cell stack MCA1, and in this case, the third conductive lines may correspond to the second conductive lines CL2.

The memory cells MC included in the first memory cell stack MCA1 may be two-dimensionally arranged to constitute rows and columns on a substrate. Each of the memory cells MC may include a switching element and a variable resistance structure. When the first conductive lines CL1 are provided between the substrate and the second conductive lines CL2, the switching element in each memory cell MC may be provided between the substrate and the variable resistance structure. Alternatively, the variable resistance structure may be provided between the substrate and the switching element. The switching element may be disposed at a corresponding one of the intersections between the first conductive lines CL1 and the second conductive lines CL2, and may be physically separated from other switching elements at adjacent intersections. The variable resistance structure may be disposed at a corresponding one of the intersections between the first conductive lines CL1 and the second conductive lines CL2, and may be physically separated from other variable resistance structures at adjacent intersections. Alternatively, a physically connected one variable resistance structure may be shared between a plurality of the memory cells MC. For example, when viewed in plan, the variable resistance structure may have a linear shape that extends along an extending direction either of the first conductive lines CL1 or of the second conductive lines CL2.

In example embodiments, the first conductive lines CL1 may be word lines and the second conductive lines CL2 may be bit lines. In other example embodiments, the first conductive lines CL1 may be bit lines and the second conductive lines CL2 may be word lines. For example, each of the memory cells MC may be positioned at each cross point between the word lines and the bit lines.

Figure 3:
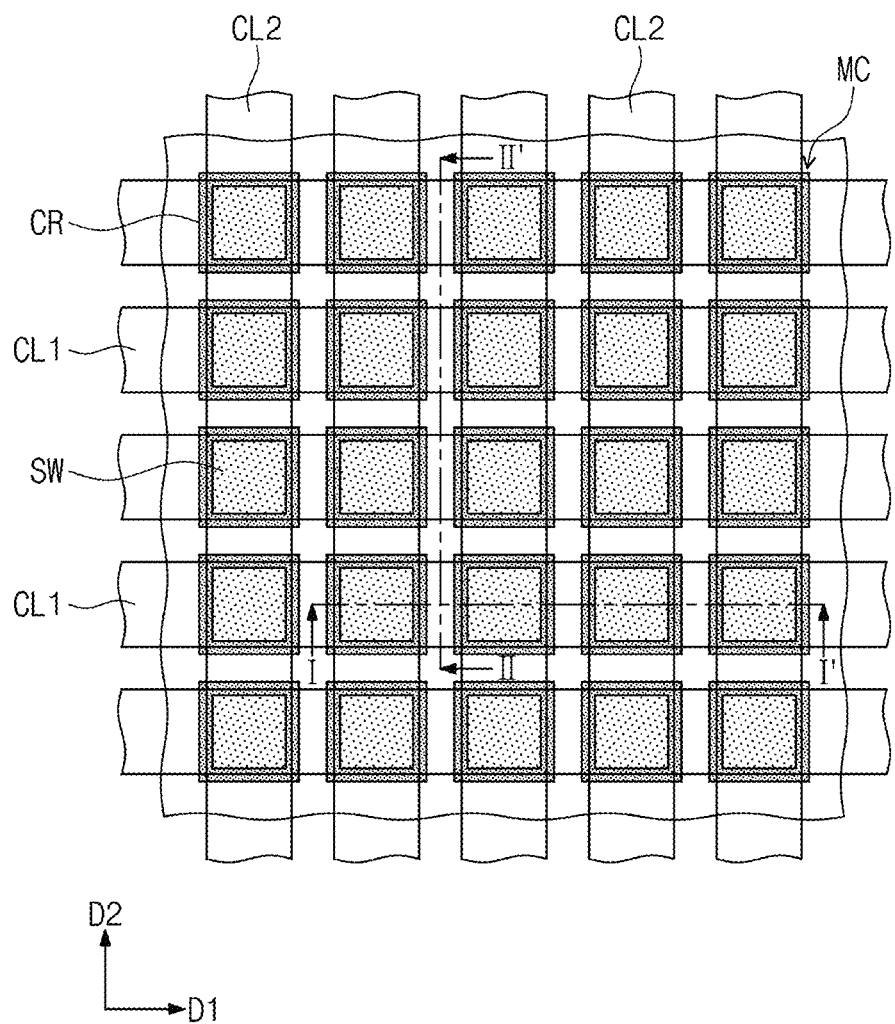
FIG. 3 illustrates a plan view showing a variable resistance memory device according to some example embodiments of the present inventive concepts.
Figure 4:
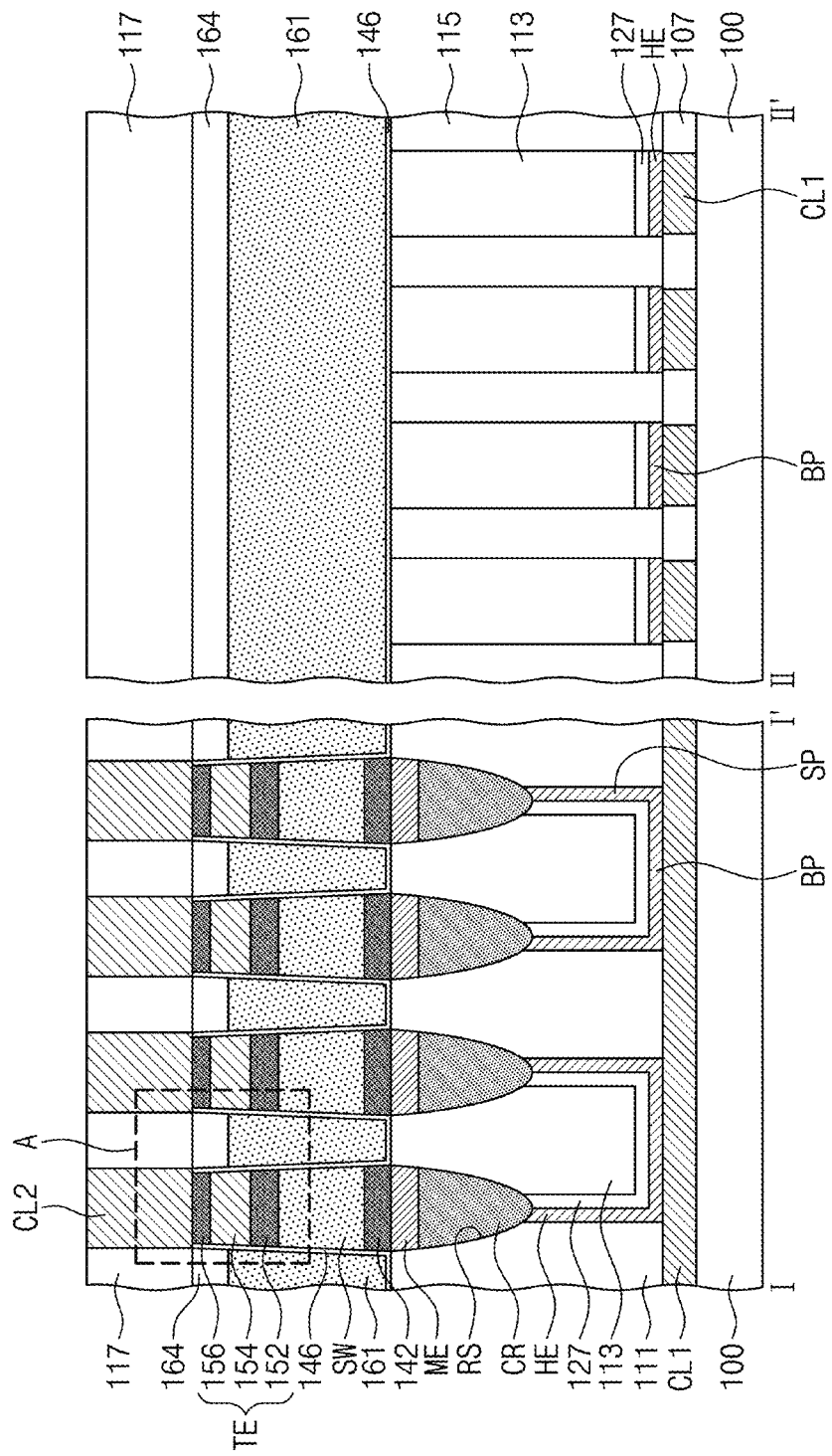
FIG. 4 illustrates a cross-sectional view taken along lines I-I' and II-II' of FIG. 3 according to example embodiments.
Figure 5:
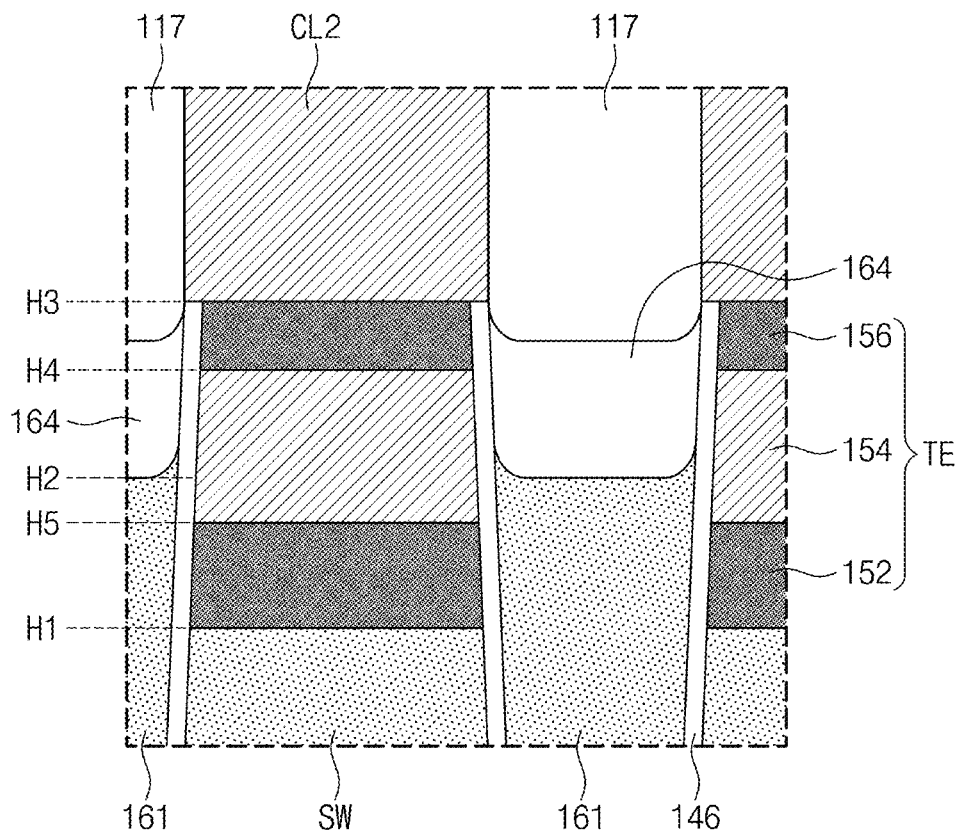
FIG. 5 illustrates an enlarged view showing section A of FIG. 4 according to example embodiments.

FIG. 3 illustrates a plan view showing a variable resistance memory device according to some example embodiments of the present inventive concepts. FIG. 4 illustrates a cross-sectional view taken along lines I-I' and II-II' of FIG. 3. FIG. 5 illustrates an enlarged view showing section A of FIG. 4 according to example embodiments.

Referring to FIGS. 3 to 5, a memory cell stack may be provided on a substrate 100. For example, the memory cell stack may correspond to one of the memory cell stacks MCA discussed with reference to FIGS. 1 and 2. The memory cell stack may be disposed between first conductive lines CL1 and second conductive lines CL2 that are sequentially provided on the substrate 100. The first conductive lines CL1 may extend along a first direction D1 that is substantially parallel to a top surface of the substrate 100, and the second conductive lines CL2 may extend along a second direction D2 that crosses the first direction D1 and is substantially parallel to the top surface of the substrate 100. The first and second conductive lines CL1 and CL2 may include a conductive material, such as copper or aluminum. The first and second conductive lines CL1 and CL2 may further include conductive metal nitride, such as TiN or WN.

A plurality of memory cells MC may be disposed at intersections between the first conductive lines CL1 and the second conductive lines CL2. Each of the memory cells MC may include a variable resistance structure CR and a switching element SW. Each of the memory cells MC may further include a middle electrode ME between the variable resistance structure CR and the switching element SW. The variable resistance structure CR may be provided between the switching element SW and the substrate 100. Alternatively, the switching element SW may be provided between the variable resistance structure CR and the substrate 100. The following description is directed toward an example in which the variable resistance structure CR is provided between the switching element SW and a corresponding one of the first conductive lines CL1, but the present inventive concepts are not limited thereto.

The first conductive lines CL1 may be provided in a lower interlayer dielectric layer 107. The variable resistance structures CR may be provided in recesses RS formed in first, second, and third interlayer dielectric layers 111, 113, and 115 disposed on the first conductive lines CL1. For example, the first, second, and third interlayer dielectric layers 111, 113, and 115 may include silicon nitride or silicon oxynitride. When viewed in plan, the recesses RS may be two-dimensionally arranged at intersections between the first conductive lines CL1 and the second conductive lines CL2. Alternatively, the variable resistance structures CR may have a plurality of linear shapes that extend along the first direction D1 or the second direction D2.

The variable resistance structures CR may be formed of at least one of materials having physical properties capable of storing data. In the case where a phase change memory device is adopted as the variable resistance memory device according to some example embodiments of the present inventive concepts, the variable resistance structures CR may include a material whose phase is reversibly changed between a crystalline state and an amorphous state based on a temperature. For example, the variable resistance structures CR may have a phase transition temperature between the crystalline state and the amorphous state of about 250° C. to about 350° C. The variable resistance structures CR may be formed of a compound in which one or more of Te and Se as chalcogen elements are combined with one or more of Ge, Sb, Bi, Pb, Sn, Ag, As, S, Si, In, Ti, Ga, P, O, and C. For example, the variable resistance structures CR may include one or more of GeSbTe, GeTeAs, SbTeSe, GeTe, SbTe, SeTeSn, GeTeSe, SbSeBi, GeBiTe, GeTeTi, InSe, GaTeSe, and InSbTe. For another example, the variable resistance structures CR may include a superlattice structure in which a Ge-containing layer and a Ge-free layer are repeatedly stacked. For example, the variable resistance structures CR may include a structure in which a GeTe layer and a SbTe layer are repeatedly stacked.

In other embodiments, the variable resistance structures CR may include one or more of perovskite compounds and conductive metal oxides. For example, the variable resistance structures CR may include one or more of niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, and barium-strontium-zirconium oxide. When the variable resistance structures CR include transition metal oxide, the variable resistance structures CR may have a dielectric constant greater than that of a silicon oxide layer. In other embodiments, the variable resistance structures CR may have either a double structure of a conductive metal oxide layer and a tunnel dielectric layer or a triple structure of a first conductive metal oxide layer, a tunnel dielectric layer, and a second conductive metal oxide layer. The tunnel dielectric layer may include aluminum oxide, hafnium oxide, or silicon oxide.

Heater electrodes HE may be provided between the first conductive lines CL1 and the variable resistance structures CR. Each of the heater electrodes HE may connect a pair of the variable resistance structures CR adjacent to each other in the first direction D1 to the first conductive lines CL1. For example, each of the heater electrodes HE may include a horizontal segment BP connected to the first conductive lines CL1, and also include a pair of vertical segments SP extending from opposite ends of the horizontal segment BP toward the pair of the variable resistance structures CR. For another example, the heater electrodes HE may be two-dimensionally arranged at intersections between the first conductive lines CL1 and the second conductive lines CL2.

The heater electrodes HE may be electrodes for heating and phase-changing the variable resistance structures CR. The heater electrodes HE may be formed of a material whose resistivity is greater than that of the first conductive lines CL1. For example, the heater electrodes HE may include one or more of W, Ti, Al, Cu, C, CN, TiN, TiAlN, TiSiN, TiCN, WN, CoSiN, WSiN, TaN, TaCN, TaSiN, and TiO.

Spacer patterns 127 may be provided between the second interlayer dielectric layer 113 and the heater electrodes HE. The spacer pattern 127 may extend along the horizontal segment BP and the vertical segments SP of the heater electrode HE. For example, the spacer pattern 127 may include one or more of silicon oxide and silicon oxynitride.

The variable resistance structures CR may occupy lower portions of the recesses RS, and the middle electrodes ME may occupy upper portions of the recesses RS. The middle electrodes ME may electrically connect the variable resistance structures CR to the switching elements SW, and may prevent direct contact between the variable resistance structures CR and the switching elements SW. The middle electrodes ME may include one or more of W, Ti, Al, Cu, C, CN, TiN, TiAlN, TiSiN, TiCN, WN, CoSiN, WSiN, TaN, TaCN, and TaSiN. The first, second, and third interlayer dielectric layers 111, 113, and 115 may have their top surfaces coplanar with those of the middle electrodes ME. Alternatively, the middle electrodes ME may be provided on the first, second, and third interlayer dielectric layers 111, 113, and 115.

Each of the switching elements SW may be an OTS (Ovonic Threshold Switch) device exhibiting bidirectional characteristics. For example, each of the switching elements SW may be a device based on a threshold switching phenomenon exhibiting a nonlinear I-V curve (e.g., S-type I-V curve). The switching elements SW may be associated with a phase transition temperature between crystalline and amorphous states that is greater than a phase transition temperature associated with the variable resistance structures CR. For example, the switching elements SW may have a phase transition temperature of about 350° C. to about 450° C. Therefore, when operating the variable resistance memory device according to some example embodiments of the present inventive concepts, the variable resistance structures CR may be configured to reversibly change phase between crystalline and amorphous states, while the switching elements SW may maintain a substantially amorphous state without the phase transition. In this description, the phrase "substantially amorphous state" may not exclude the presence of a locally crystalline grain boundary or a locally crystalline portion in an object.

The switching elements SW may be formed of a compound in which one or more of Te and Se as chalcogen elements are combined with one or more of Ge, Sb, Bi, Al, Pb, Sn, Ag, As, S, Si, In, Ti, Ga, and P. The switching elements SW may further include a thermal stabilization element in addition to the compound. The thermal stabilization element may be one or more of C, N, and O. For example, the switching elements SW may include one or more of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe.

Bottom carbon electrode patterns 142 may be provided between the switching elements SW and the middle electrodes ME. For example, the bottom carbon electrode patterns 142 may include a carbon-containing conductive material.

Top electrodes TE may be provided between the switching elements SW and the second conductive lines CL2. The top electrodes TE may be two-dimensionally spaced apart from each other on corresponding switching elements SW. Alternatively, each of the top electrodes TE may be connected in common to the switching elements SW arranged along the first direction D1.

The second conductive lines CL2 may be provided on the top electrodes TE. The second conductive lines CL2 may be spaced apart in the first direction D1 from each other across a third dielectric layer 117. The third dielectric layer 117 may include, for example, silicon oxide or silicon oxynitride.

A first dielectric layer 161 may be provided to fill a space between the switching elements SW. The first dielectric layer 161 may be a low-k dielectric layer. For example, the first dielectric layer 161 may have a dielectric constant less than that of a second dielectric layer which will be discussed below. The low dielectric constant of the first dielectric layer 161 may reduce cross-talk between the memory cells MC.

The first dielectric layer 161 may contain carbon. For example, the first dielectric layer 161 may include one or more of silicon oxycarbide, silicon oxycarbonitride, and silicon carbonitride. When viewed in plan, the first dielectric layer 161 may have a grid shape. The first dielectric layer 161 may have a bottom surface higher than top surfaces of the variable resistance structures CR.

The following will describe in detail the top electrode TE and the first dielectric layer 161.

As shown in FIG. 5, the first dielectric layer 161 may have a top surface H2 higher than a bottom surface H1 of the top electrode TE and lower than a top surface H3 of the top surface TE. For example, the top surface H2 of the first dielectric layer 161 may horizontally overlap the top electrodes TE. In the embodiment of FIG. 5, the top electrode TE may include a first carbon electrode pattern 152, a metal pattern 154, and a second carbon electrode pattern 156 that are sequentially stacked. The top surface H2 of the first dielectric layer 161 may be lower than a top surface H4 of the metal pattern 154. The top surface H2 of the first dielectric layer 161 may be lower than a bottom surface of the second carbon electrode pattern 156. The top surface H2 of the first dielectric layer 161 may be higher than a bottom surface H5 of the metal pattern 154. The top surface H2 of the first dielectric layer 161 may be higher than a top surface of the first carbon electrode pattern 152. Alternatively, the top surface H2 of the first dielectric layer 161 may be lower than the top surface of the first carbon electrode pattern 152. In this case, the top surface H2 of the first dielectric layer 161 may be lower than the bottom surface H5 of the metal pattern 154.

The first and second carbon electrode patterns 152 and 156 may include a carbon-containing conductive material. The metal pattern 154 may include one or more of W, Ti, Al, Cu, C, CN, TiN, TiAlN, TiSiN, TiCN, WN, CoSiN, WSiN, TaN, TaCN, and TaSiN. For example, the first carbon electrode pattern 152 may have a thickness greater than that of the second carbon electrode pattern 156.

A second dielectric layer 164 may be provided on the first dielectric layer 161. The second dielectric layer 164 may fill a space between the top electrodes TE. When viewed in plan, the second dielectric layer 164 may have a grid shape. The second dielectric layer 164 may have a dielectric constant greater than that of the first dielectric layer 161. For example, the second dielectric layer 164 may include silicon oxide or silicon oxynitride.

The second dielectric layer 164 may have a bottom surface corresponding to the top surface H2 of the first dielectric layer 161. The second dielectric layer 164 may have a top surface at a height the same as or lower than that of the top surface H3 of the top electrode TE.

The second dielectric layer 164 may be provided thereon with the third dielectric layer 117 filling a space between the second conductive lines CL2. The third dielectric layer 117 may include a plurality of dielectric patterns that are separated in the first direction D1 from each other across the second conductive lines CL2. The third dielectric layer 117 may have a bottom surface lower than the top surface H3 of the top electrode TE. The third dielectric layer 117 may have a dielectric constant greater than that of the first dielectric layer 161. For example, the third dielectric layer 117 may include silicon oxide or silicon oxynitride. The third dielectric layer 117 may be formed of a material the same as or different from that of the second dielectric layer 164.

Figure 6:
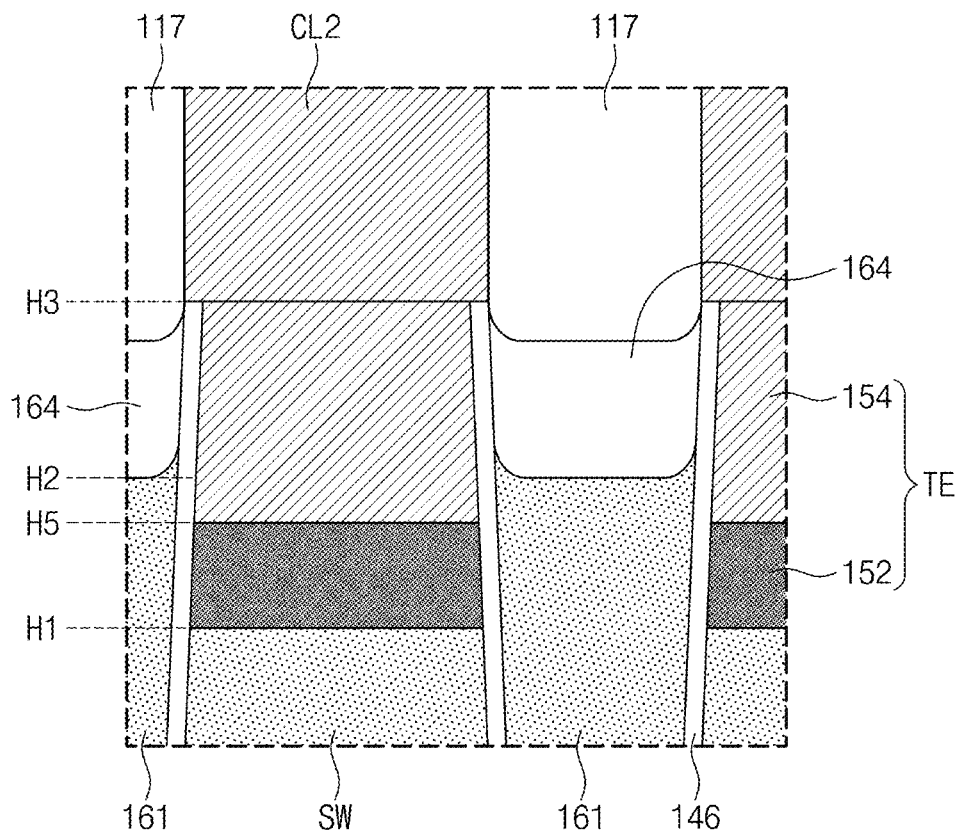
FIG. 6 illustrates an enlarged view showing section A of FIG. 4 according to example embodiments.

FIG. 6 illustrates an enlarged view showing section A of FIG. 4 according to example embodiments. For brevity of description, explanations of duplicate components will be omitted. Referring to FIG. 6, the top electrode TE may include the first carbon electrode pattern 152 and the metal pattern 154 on the first carbon electrode pattern 152. In the present embodiment, the second carbon electrode pattern (see 156 of FIG. 5) may not be provided. The metal pattern 154 may contact the second conductive lines CL2. The top surface H2 of the first dielectric layer 161 may be higher than the bottom surface H5 of the metal pattern 154. The bottom surface of the third dielectric layer 117 may be lower than a top surface H3 of the metal pattern 154.

Figure 7:
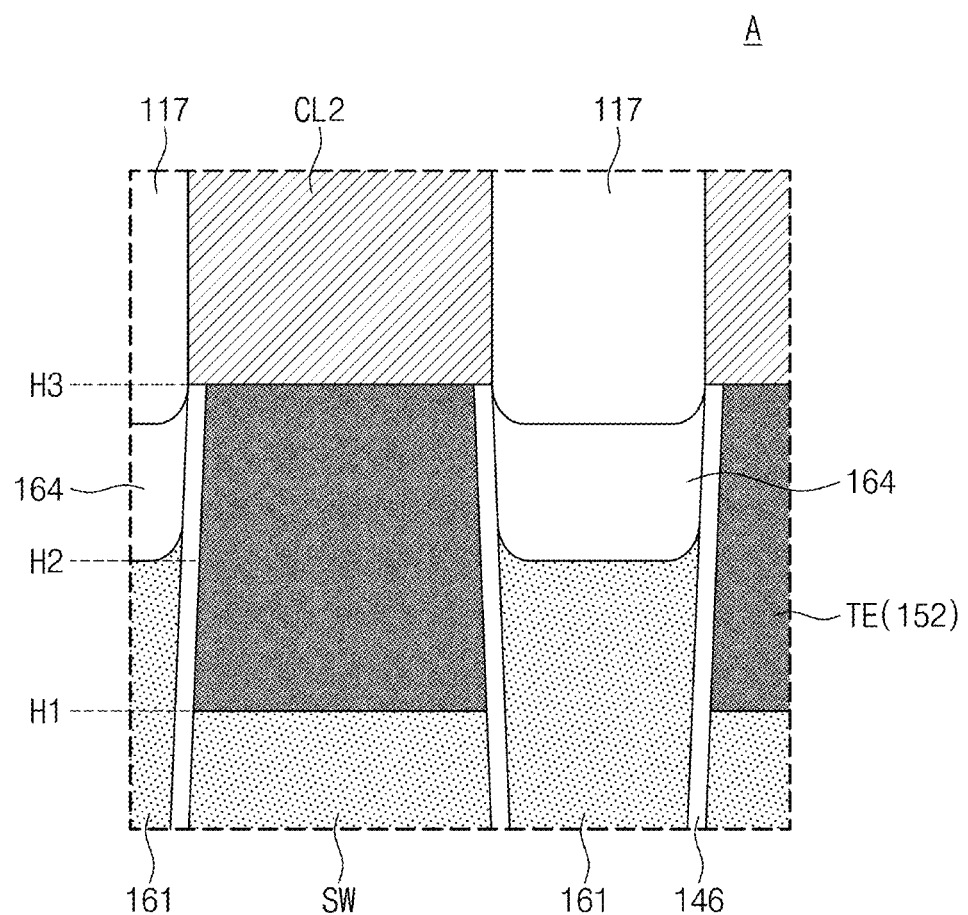
FIG. 7 illustrates an enlarged view showing section A of FIG. 4 according to example embodiments.

FIG. 7 illustrates an enlarged view showing section A of FIG. 4 according to example embodiments. Referring to FIG. 7, the top electrode TE may include the carbon electrode pattern 152. The carbon electrode pattern 152 may have a top surface H3 in contact with the second conductive lines CL2. The carbon electrode pattern 152 may have a bottom surface H1 in contact with a top surface of the switching element SW. The top surface H2 of the first dielectric layer 161 may be higher than the bottom surface H1 of the carbon electrode pattern 152 and lower than the top surface H3 of the carbon electrode pattern 152. The bottom surface of the third dielectric layer 117 may be lower than the top surface H3 of the carbon electrode pattern 152.

Referring back to FIGS. 3 and 4, a sidewall dielectric layer 146 may be provided between the switching elements SW and the first dielectric layer 161. The sidewall dielectric layer 146 may extend onto the bottom surface of the first dielectric layer 161. For example, the sidewall dielectric layer 146 may extend between the first dielectric layer 161 and each of the first, second, and third interlayer dielectric layers 111, 113, and 115. The sidewall dielectric layer 146 may extend onto sidewalls of the top electrodes TE. For example, the sidewall dielectric layer 146 may have a top surface coplanar with those of the top electrodes TE. The sidewall dielectric layer 146 may contain no oxygen. The sidewall dielectric layer 146 may include a material whose dielectric constant is greater than that of the first dielectric layer 161. As an example, the sidewall dielectric layer 146 may include a silicon nitride layer. As another example, the sidewall dielectric layer 146 may include a silicon nitride layer and a silicon oxide layer.

According to some example embodiments of the present inventive concepts, the memory cells MC may have reduced cross-talk therebetween. In addition, the memory cells MC may have less voids therebetween.

FIGS. 8 to 16 illustrate cross-sectional views taken along lines I-I' and II-II' of FIG. 3, showing a method of fabricating a variable resistance memory device according to some example embodiments of the present inventive concepts.

Figure 8:
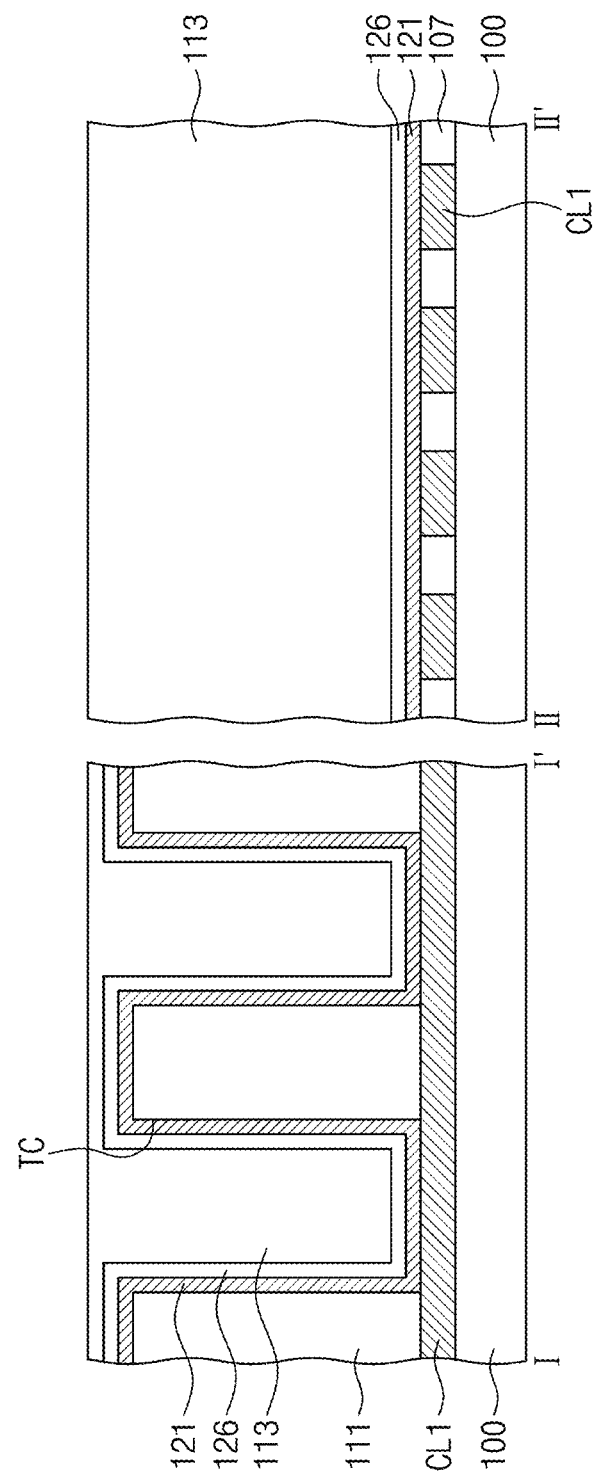
FIGS. 8 to 16 illustrate cross-sectional views taken along lines I-I' and II-II' of FIG. 3, showing a method of fabricating a variable resistance memory device according to some example embodiments of the present inventive concepts.

Referring to FIGS. 3 and 8, first conductive lines CL1 may be formed on a substrate 100. The first conductive lines CL1 may be provided in a lower interlayer dielectric layer 107. A first interlayer dielectric layer 111 may be formed on the first conductive lines CL1, and then trenches TC extending in a first direction D1 may be formed in the first interlayer dielectric layer 111. The formation of the trenches TC may include an anisotropic etch process. Each of the trenches TC may intersect a plurality of the first conductive lines CL1. The first interlayer dielectric layer 111 may be formed of, for example, silicon nitride or silicon oxynitride.

An electrode layer 121 and a spacer layer 126 may be sequentially formed on the first interlayer dielectric layer 111 having the trenches TC therein. The electrode layer 121 and the spacer layer 126 may be conformally formed along shapes of the trenches TC. The electrode layer 121 may include one or more of W, Ti, Al, Cu, C, CN, TiN, TiAlN, TiSiN, TiCN, WN, CoSiN, WSiN, TaN, TaCN, TaSiN, and TiO. The spacer layer 126 may include one or more of silicon oxide and silicon oxynitride. A second interlayer dielectric layer 113 filling the trenches TC may be formed on the spacer layer 126. The second interlayer dielectric layer 113 may be formed of, for example, the same material as that the first interlayer dielectric layer 111.

Figure 9:
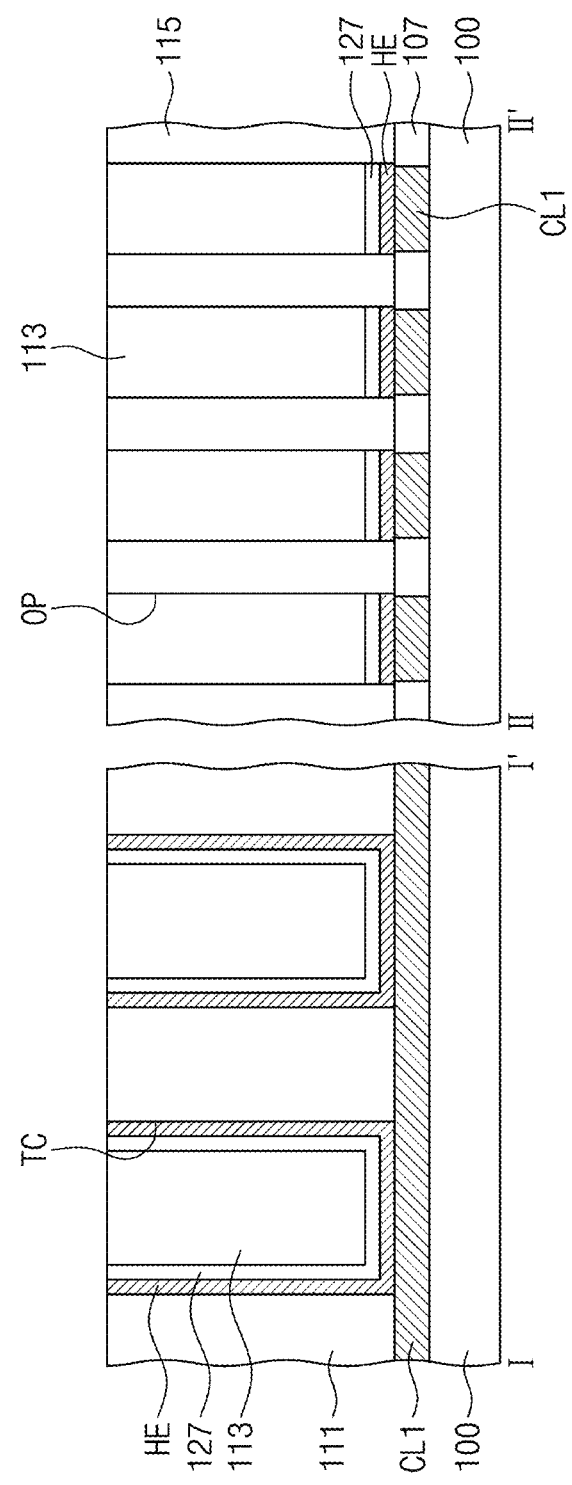

Referring to FIGS. 3 and 9, a planarization process may be performed until the first interlayer dielectric layer 111 is exposed. The second interlayer dielectric layer 113, the spacer layer 126, and the electrode layer 121 may be sequentially etched to form openings OP. As a result, the electrode layer 121 may convert into heater electrodes HE, and the spacer layer 126 may convert into spacer patterns 127. The heater electrodes HE may be spaced apart from each other in the first direction D1 and a second direction D2, and the same may hold true of the spacer patterns 127.

A third interlayer dielectric layer 115 may be formed to fill the openings OP. The formation of the third interlayer dielectric layer 115 may include a planarization process. The third interlayer dielectric layer 115 may be formed of the same material as that the first interlayer dielectric layer 111.

Figure 10:
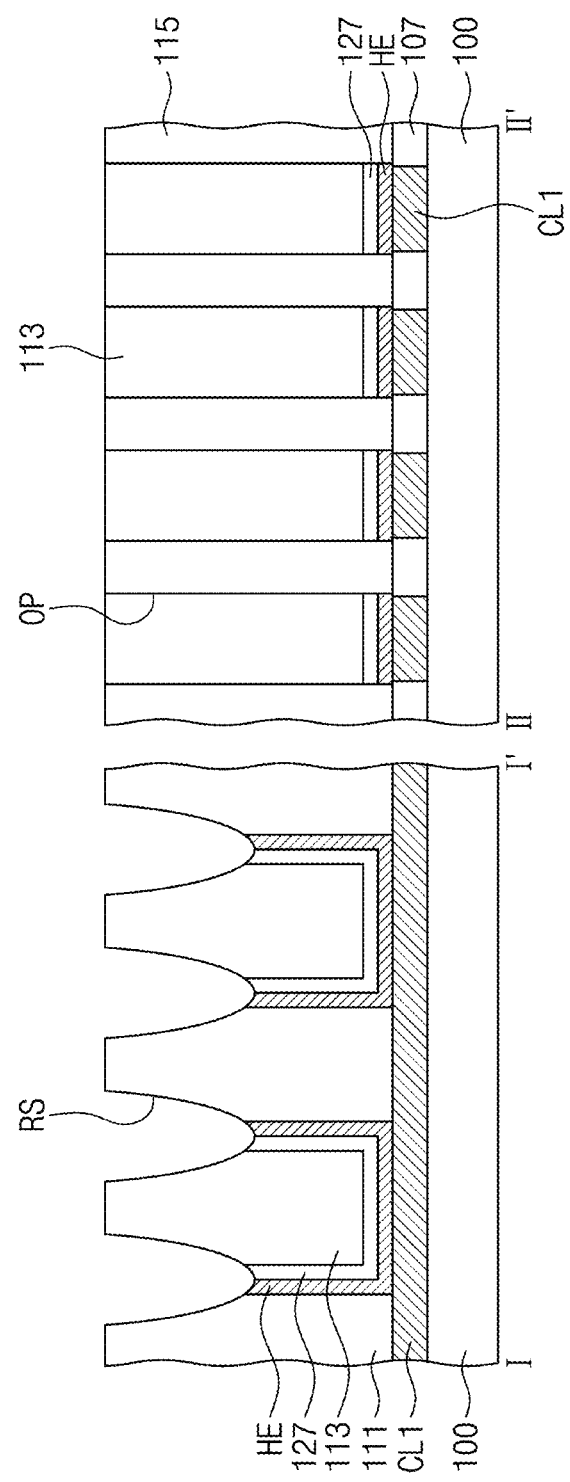

Referring to FIGS. 3 and 10, recesses RS may be formed to expose upper portions of the heater electrodes HE. The formation of the recesses RS may include etching upper portions of the spacer patterns 127 and etching upper portions of the heater electrodes HE. A wet etching process may be used to etch the spacer patterns 127 and the heater electrodes HE. An isotropic wet etching process may be performed to expand empty spaces that are formed by the removal of the upper portions of the heater electrodes HE and of the spacer patterns 127. For example, the isotropic wet etching process may use an etchant including phosphoric acid.

Figure 11:
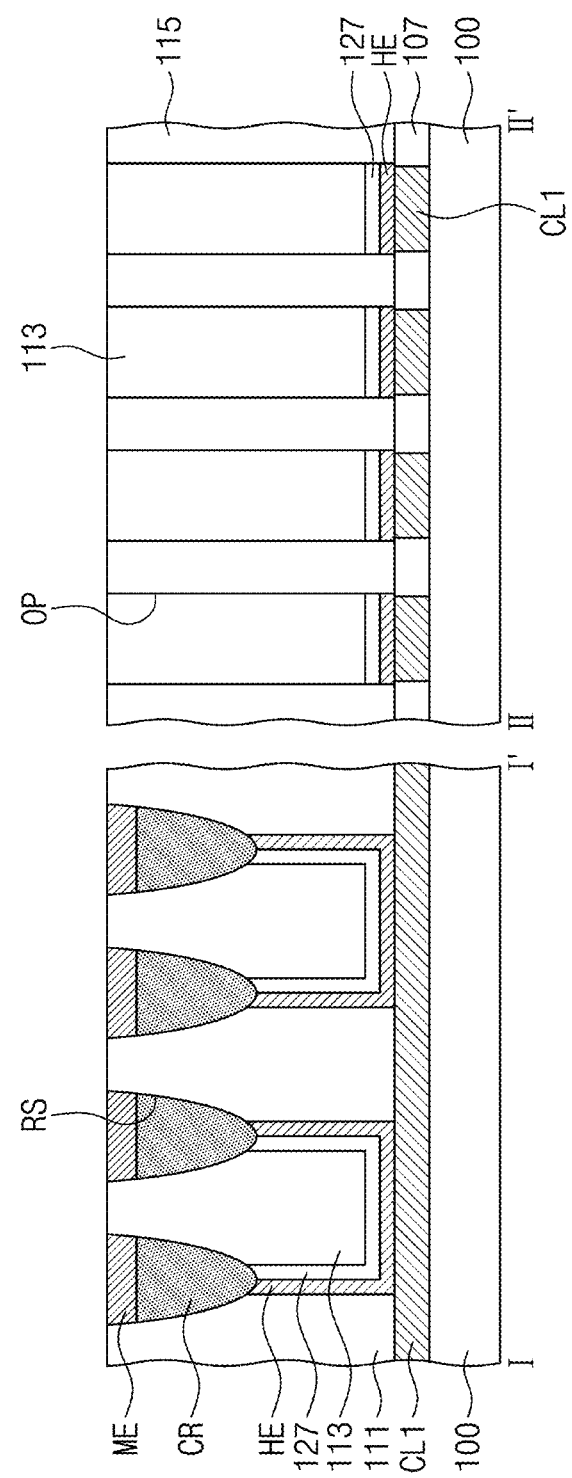

Referring to FIGS. 3 and 11, variable resistance structures CR and middle electrodes ME may be sequentially formed in the recesses RS. The variable resistance structures CR may be formed by forming a variable resistance layer to fill the recesses RS and then etching an upper portion of the variable resistance layer. The variable resistance layer may include one or more of GeSbTe, GeTeAs, SbTeSe, GeTe, SbTe, SeTeSn, GeTeSe, SbSeBi, GeBiTe, GeTeTi, InSe, GaTeSe, and InSbTe. The variable resistance layer may be formed by physical vapor deposition or chemical vapor deposition.

The middle electrodes ME may be formed in upper portions of the recesses RS. The middle electrodes ME may be formed by forming an electrode layer on a resultant structure having the variable resistance structures CR and then performing a planarization process on the electrode layer. Alternatively, the formation of the middle electrodes ME may be omitted. The middle electrodes ME may include one or more of W, Ti, Al, Cu, C, CN, TiN, TiAlN, TiSiN, TiCN, WN, CoSiN, WSiN, TaN, TaCN, and TaSiN.

Figure 12:
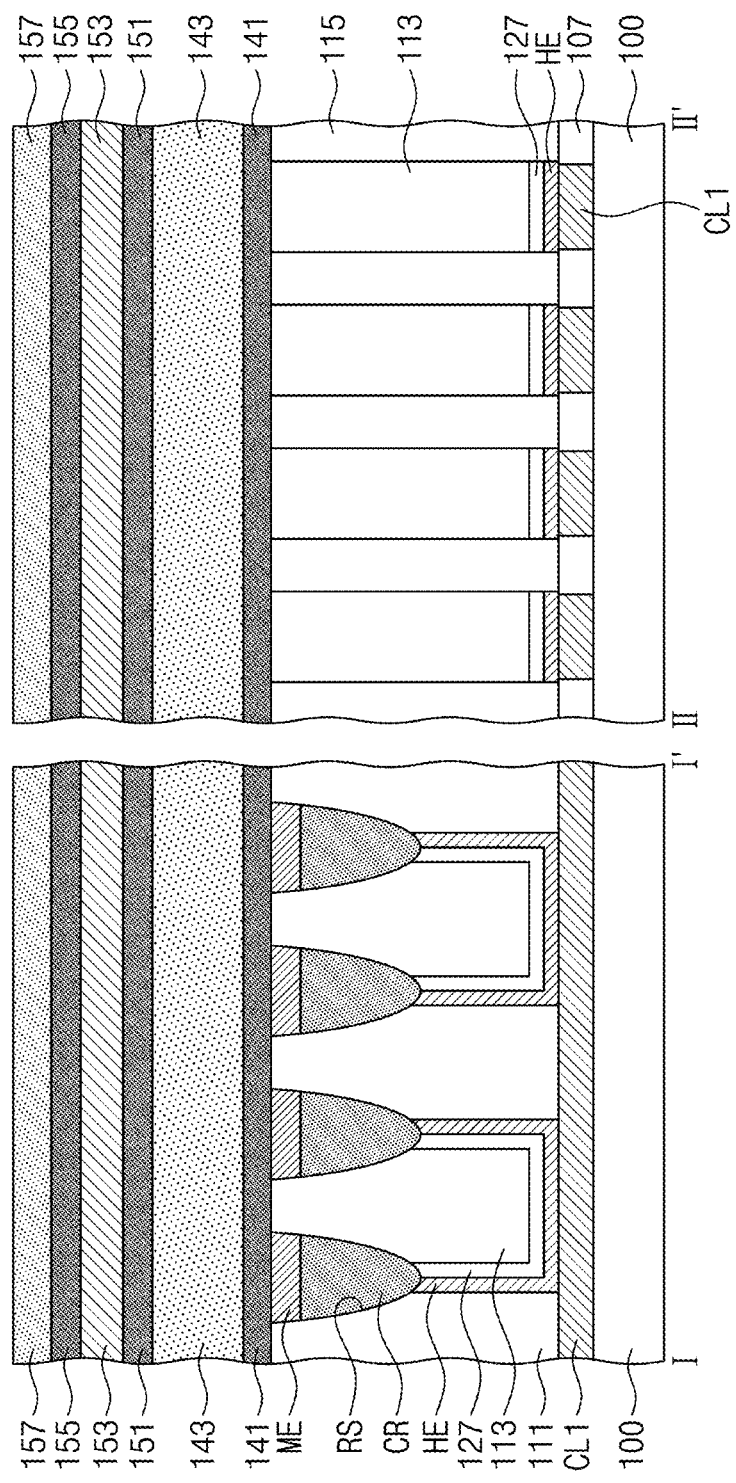

Referring to FIGS. 3 and 12, a bottom carbon electrode layer 141, a switching layer 143, and top electrode layers 151, 153, and 155 may be sequentially formed on a resultant structure having the middle electrodes ME. A mask layer 157 may be formed on the top electrode layers 151, 153, and 155. The top electrode layers 151, 153, and 155 may include a first carbon electrode layer 151, a metal layer 153, and a second carbon electrode layer 155. The first and second carbon electrode layers 151 and 155 may be formed of a carbon-containing conductive material. The metal layer 153 may be formed of one or more of W, Ti, Al, Cu, C, CN, TiN, TiAlN, TiSiN, TiCN, WN, CoSiN, WSiN, TaN, TaCN, and TaSiN. Alternatively, as discussed with reference to FIG. 6 or 7, one of the first and second carbon electrode layers 151 and 155 and/or the metal layer 153 may not be formed.

Figure 13:
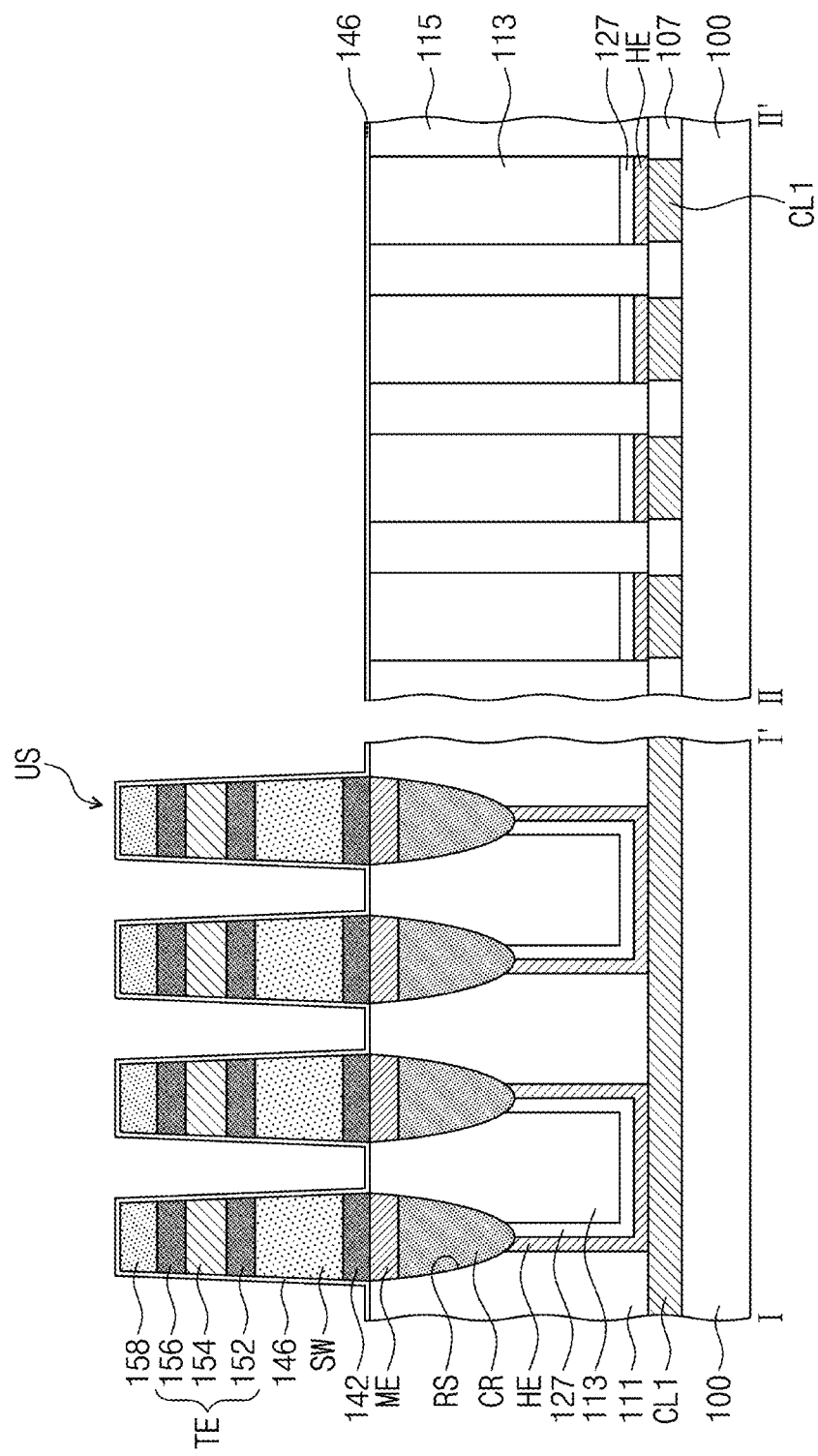

Referring to FIGS. 3 and 13, the mask layer 157 may convert into mask patterns 158, and then the mask patterns 158 may be used to sequentially etch the top electrode layers 151, 153, and 155, the switching layer 143, and the bottom carbon electrode layer 141. As a result, upper structures US may be formed to include bottom carbon electrode patterns 142, switching elements SW, and top electrodes TE. Each of the top electrodes TE may include a first carbon electrode pattern 152, a metal pattern 154, and a second carbon electrode pattern 156. The upper structures US may be two-dimensionally spaced apart from each other along the first and second directions D1 and D2. The switching layer 143 may be formed of a compound in which one or more of Te and Se as chalcogen elements are combined with one or more of Ge, Sb, Bi, Al, Pb, Sn, Ag, As, S, Si, In, Ti, Ga, and P. The switching layer 143 may further include a thermal stabilization element in addition to the compound.

A sidewall dielectric layer 146 may be formed to cover the upper structures US. For example, the sidewall dielectric layer 146 may be formed by chemical vapor deposition. The sidewall dielectric layer 146 may be of an oxygen-free material. For example, the sidewall dielectric layer 146 may include a silicon nitride layer.

Figure 14:
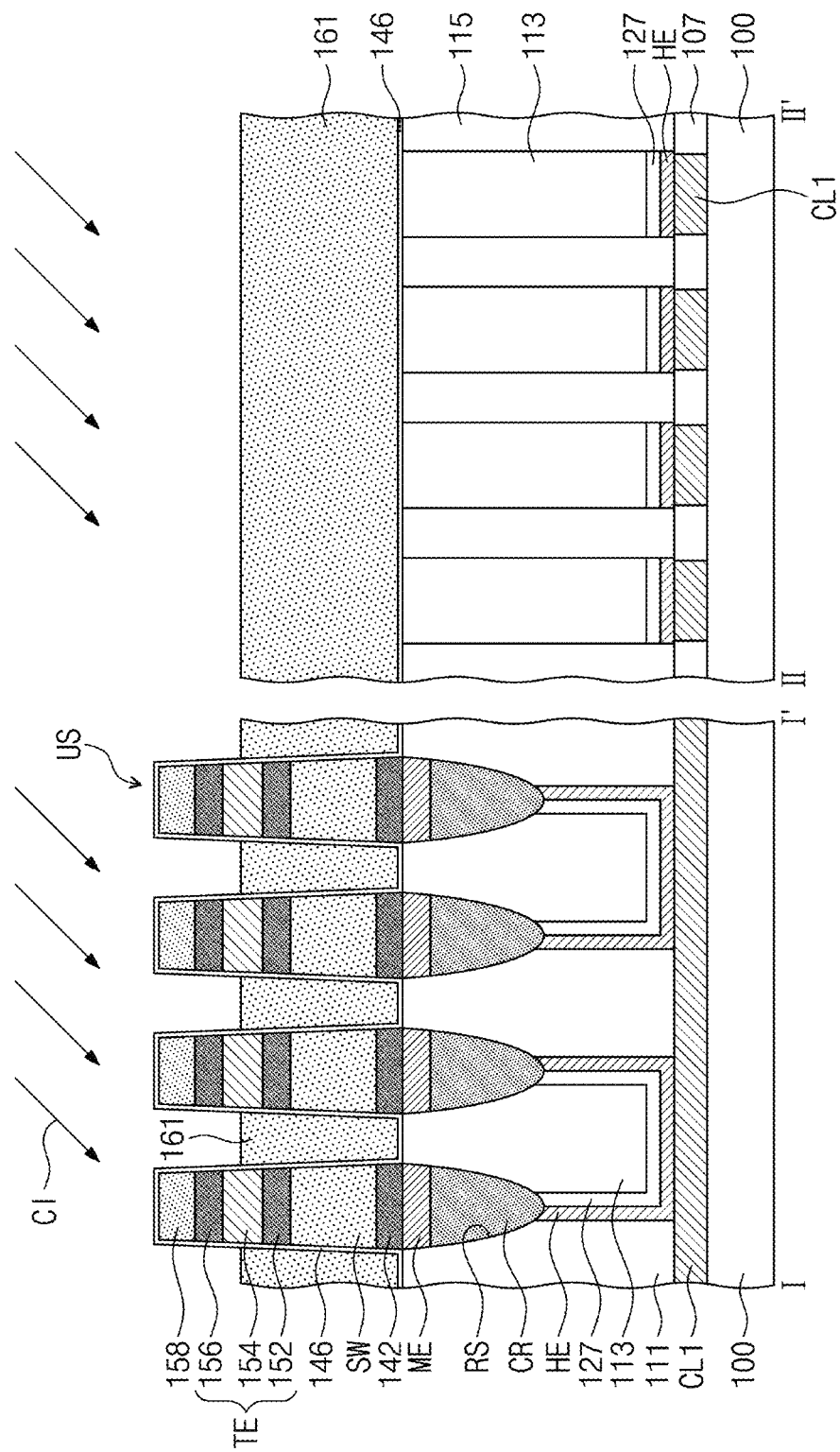

Referring to FIGS. 3 and 14, a first dielectric layer 161 may be formed between the upper structures US. The formation of the first dielectric layer 161 may include performing a flowable chemical vapor deposition process to form a preliminary first dielectric layer, and performing a curing process C1 on the preliminary first dielectric layer. The preliminary first dielectric layer formed by the flowable chemical vapor deposition process may sequentially fill from lower toward upper portions between the upper structures US, and may grow relatively less from sidewalls of the upper structures US. As a result, the formation of voids may be reduced between the upper structures US. The curing process C1 may be an ultraviolet curing process, a thermal curing process, a plasma curing process, or the like. The first dielectric layer 161 may contain carbon. For example, the first dielectric layer 161 may include one or more of silicon oxycarbide, silicon oxycarbonitride, and silicon carbonitride.

After the formation of the first dielectric layer 161 is terminated, an etch-back process may be performed. For example, the etch-back process may be performed by a wet etching process. The first dielectric layer 161 may have a top surface whose height depends on the etch-back process. For example, the etch-back process may control to cause the first dielectric layer 161 to have the height discussed with reference to FIGS. 5 to 7. Alternatively, no etch-back process may be performed.

Figure 15:
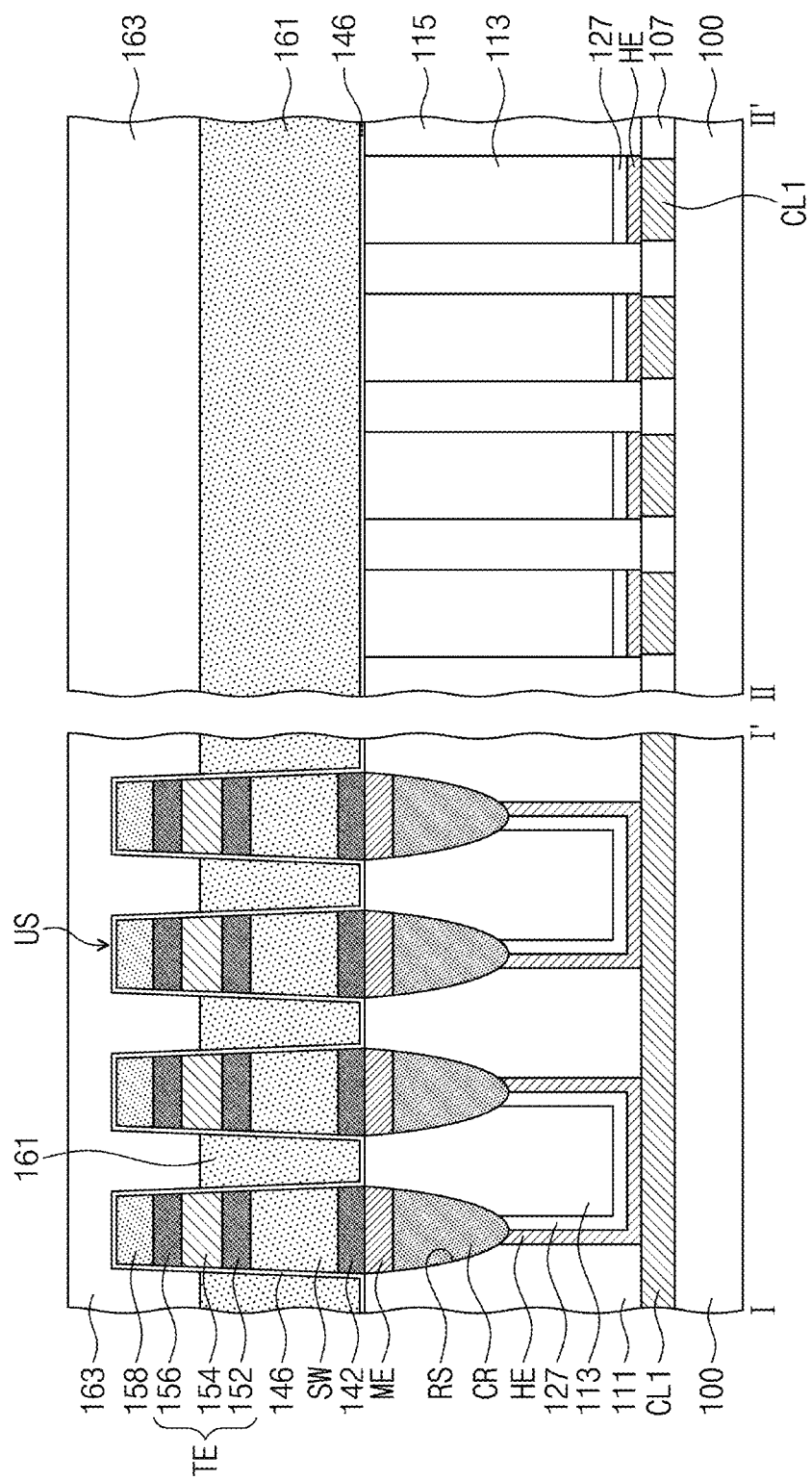

Referring to FIGS. 3 and 15, a preliminary second dielectric layer 163 may be formed on the first dielectric layer 161. The formation of the preliminary second dielectric layer 163 may use different process and chamber from those used for formation of the first dielectric layer 161. The preliminary second dielectric layer 163 may be formed by, for example, an atomic layer deposition (ALD) or a chemical vapor deposition (CVD). For example, the CVD process may be performed by either a flowable CVD or a non-flowable CVD. The preliminary second dielectric layer 163 may contain no carbon. For example, the preliminary second dielectric layer 163 may include one or more of a silicon oxide layer and a silicon oxynitride layer.

Figure 16:
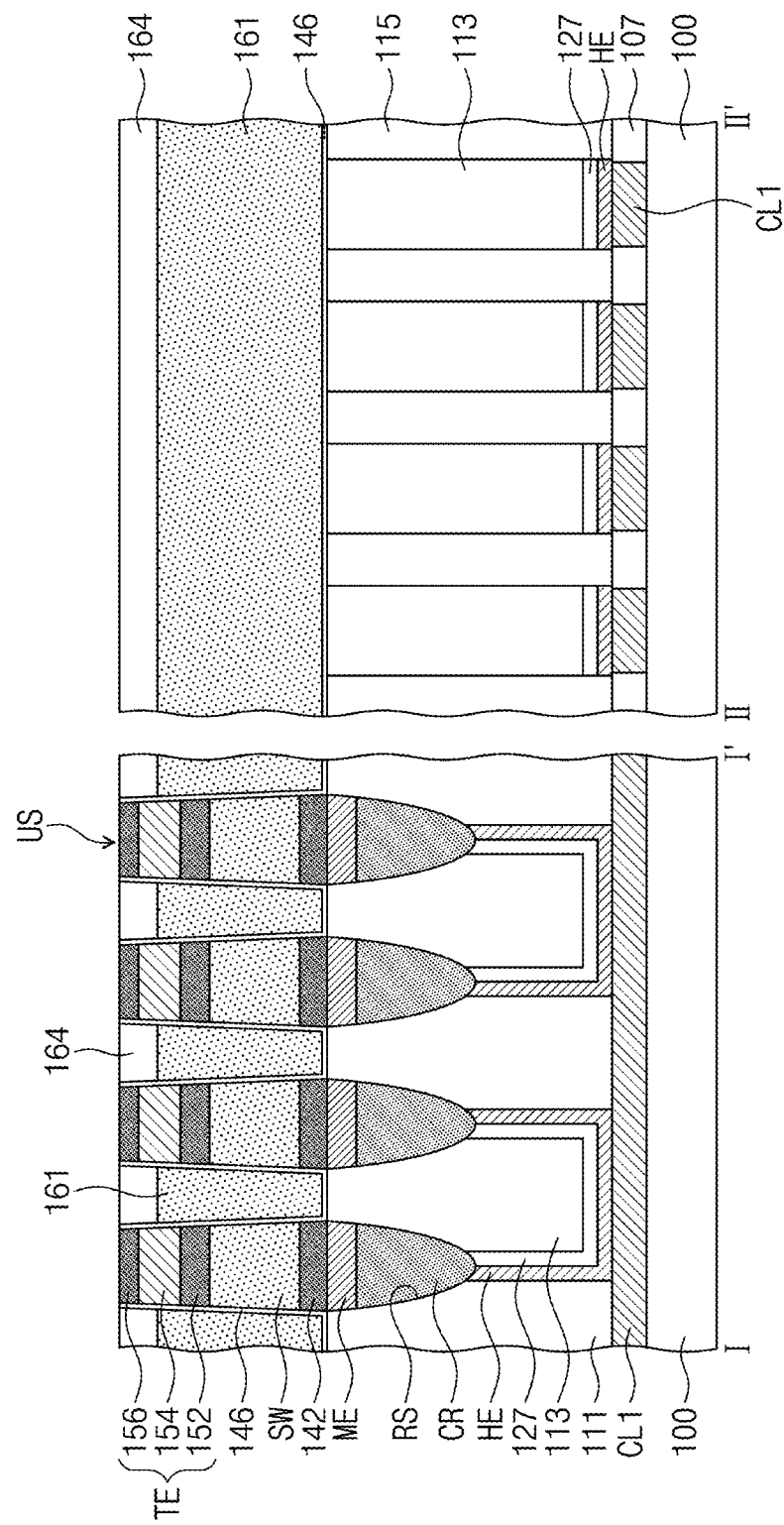

Referring to FIGS. 3 and 16, the preliminary second dielectric layer 163 may undergo a planarization process to form a second dielectric layer 164. When the planarization process is performed, the mask patterns 158 may also be removed. In addition, the planarization process may remove a portion of the second carbon electrode pattern 156 and a portion of the sidewall dielectric layer 146. Therefore, after the planarization process, the second carbon electrode pattern 156 may have a thickness less than that of the first carbon electrode pattern 152.

Referring back to FIGS. 3 and 4, second conductive lines CL2 may be formed on the top electrodes TE. The formation of the second conductive lines CL2 may include forming a conductive layer on the top electrodes TE and then patterning the conductive layer. A third dielectric layer 117 may be formed to fill a space between the second conductive lines CL2. For example, the third dielectric layer 117 may include one or more of a silicon oxide layer and a silicon oxynitride layer.

According to some example embodiments of the present inventive concepts, a space between the upper structures US may be filled using a material or method that has less occurrence of voids. Therefore, it may be possible to prevent reliability from degradation caused when voids are filled with a conductive material or an etching material. In addition, because a target of the planarization process is the second dielectric layer containing no carbon, the planarization process may be easily performed.

A variable resistance memory device according to the present inventive concepts may reduce cross-talk between the memory cells whose dielectric constant is low. A method of manufacturing a variable resistance memory device may alleviate the occurrence of voids between the memory cells. Moreover, a planarization process may be easily performed.

Although exemplary embodiments of the present inventive concepts have been discussed with reference to accompanying figures, it will be understood that various changes in form and details may be made therein without departing from the spirit and scope of the present inventive concepts as defined by the following claims. It therefore will be understood that some example embodiments described above are just illustrative but not limitative in all aspects.

What is claimed is:

1. A variable resistance memory device, comprising:
   a plurality of first conductive lines extending in a first direction;
   a plurality of second conductive lines extending in a second direction;
   a plurality of memory cells, each memory cell at a respective intersection, between a corresponding one of the first conductive lines and a corresponding one of the second conductive lines, each memory cell comprising a variable resistance structure and a switching element sandwiched between a top electrode and a bottom electrode;
   a first dielectric layer filling a space between the switching elements of the memory cells; and
   a third dielectric layer filling a space between the second conductive lines and extending between the top electrodes of the memory cells,
   wherein a top surface of the first dielectric layer is disposed between bottom and top surfaces of the top electrodes of the memory cells, and
   wherein the bottommost surface of the third dielectric layer is disposed between bottom and top surfaces of the top electrodes of the memory cells.

2. The variable resistance memory device of claim 1, further comprising a second dielectric layer between the first dielectric layer and the third dielectric layer and filling a space between the top electrodes of the memory cells,
   wherein the first dielectric layer has a dielectric constant less than a dielectric constant of the second dielectric layer.

3. The variable resistance memory device of claim 2,
   wherein the third dielectric layer has a dielectric constant greater than the dielectric constant of the first dielectric layer.

4. The variable resistance memory device of claim 2, wherein each of the top electrodes includes a first carbon electrode pattern, a metal pattern, and a second carbon electrode pattern that are sequentially stacked, and
   wherein the top surface of the first dielectric layer is lower than a top surface of the metal pattern.

5. The variable resistance memory device of claim 4, wherein the top surface of the first dielectric layer is higher than a bottom surface of the metal pattern.

6. The variable resistance memory device of claim 2, wherein each of the top electrodes includes a carbon electrode pattern and a metal pattern on the carbon electrode pattern.

7. The variable resistance memory device of claim 6, wherein a top surface of the metal pattern contacts the second conductive lines, and
   wherein the top surface of the first dielectric layer is higher than a bottom surface of the metal pattern.

8. The variable resistance memory device of claim 2, wherein each of the top electrodes includes a carbon electrode pattern, and
   wherein the top surface of the first dielectric layer is higher than a bottom surface of the carbon electrode pattern and lower than a top surface of the carbon electrode pattern.

9. The variable resistance memory device of claim 2, wherein the first dielectric layer contains carbon, and
   wherein the second dielectric layer contains no carbon.

10. The variable resistance memory device of claim 1, further comprising a sidewall dielectric layer between the first dielectric layer and the switching elements,
    wherein a dielectric constant of the first dielectric layer is less than a dielectric constant of the sidewall dielectric layer.

11. The variable resistance memory device of claim 10, wherein the sidewall dielectric layer extends onto a bottom surface of the first dielectric layer.

12. The variable resistance memory device of claim 10, wherein the sidewall dielectric layer includes one or more of a silicon nitride and a silicon oxide.

13. The variable resistance memory device of claim 10, further comprising a second dielectric layer on the first dielectric layer and filling a space between the top electrodes of the memory cells.

14. A variable resistance memory device, comprising:
    a plurality of first conductive lines extending in a first direction;
    a plurality of second conductive lines extending in a second direction;
    a plurality of switching elements at intersections between the first conductive lines and the second conductive lines;
    a plurality of variable resistance structures between the switching elements and the first conductive lines;
    a plurality of top electrodes between the switching elements and the second conductive lines;
    a first dielectric layer filling a space between the switching elements; and
    a second dielectric layer on the first dielectric layer and filling a space between the top electrodes, the second dielectric layer having a dielectric constant greater than a dielectric constant of the first dielectric layer,
    wherein a bottom surface of the first dielectric layer is higher than top surfaces of the variable resistance structures.

15. The variable resistance memory device of claim 14, wherein a top surface of the first dielectric layer is disposed between bottom and top surfaces of the top electrodes.

16. The variable resistance memory device of claim 14, further comprising a third dielectric layer on the second dielectric layer and filing a space between the second conductive lines,
    wherein the third dielectric layer having a dielectric constant greater than a dielectric constant of the first dielectric layer.

17. The variable resistance memory device of claim 14, wherein each of the top electrodes includes a carbon electrode pattern, and wherein a top surface of the first dielectric layer is higher than a bottom surface of the carbon electrode pattern.

18. The variable resistance memory device of claim 14, further comprising a sidewall dielectric layer between the first dielectric layer and the switching elements, wherein the dielectric constant of the first dielectric layer is less than a dielectric constant of the sidewall dielectric layer.

19. The variable resistance memory device of claim 14, wherein the first dielectric layer contains carbon, and wherein the second dielectric layer contains no carbon.

20. A variable resistance memory device, comprising:

a plurality of first conductive lines extending in a first direction;

a plurality of second conductive lines extending in a second direction;

a plurality of memory cells, each memory cell at a respective intersection, with respect to a top down view, between a corresponding one of the first conductive lines and a corresponding one of the second conductive lines, each memory cell comprising a variable resistance structure and a switching element sandwiched between a top electrode and a bottom electrode;

a first dielectric layer filling a space between the switching elements of the memory cells;

a second dielectric layer on the first dielectric layer and filling a space between the top electrodes of the memory cells; and a third dielectric layer extending in the second direction on the second dielectric layer and filling a space between the second conductive lines, wherein a top surface of the first dielectric layer is disposed between bottom and top surfaces of the top electrodes of the memory cells, wherein a dielectric constant of the first dielectric layer is less than a dielectric constant of each of the second and third dielectric layers, and wherein the third dielectric layer contacts the second dielectric layer.

\* \* \* \* \*